(12) United States Patent (10) Patent No.: US 9,282,650 B2
Dhavaleswarapu et al. (45) Date of Patent: Mar. 8, 2016

(54) THERMAL COMPRESSION BONDING PROCESS COOLING MANIFOLD

(71) Applicant: Intel Corporation, Santa Clara, CA (US)

(72) Inventors: Hemanth Dhavaleswarapu, Chandler, AZ (US); Zhihua Li, Chandler, AZ (US); Joseph Petrini, Gilbert, AZ (US); Steven B. Roach, Chandler, AZ (US); Shankar Devasenathipathy, Tempe, AZ (US); George Kostiew, Scottsdale, AZ (US); Amram Eitan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 14/132,883

(22) Filed: Dec. 18, 2013

(65) Prior Publication Data

US 2015/0173209 A1 Jun. 18, 2015

(51) Int. Cl.

| | |
|---|---|
| *B23K 37/00* | (2006.01) |
| *H05K 3/34* | (2006.01) |
| *B23K 1/00* | (2006.01) |
| *B23K 3/04* | (2006.01) |
| *H01L 23/00* | (2006.01) |
| *B23K 3/08* | (2006.01) |
| *B23K 20/02* | (2006.01) |

(52) U.S. Cl.
CPC ............ *H05K 3/3436* (2013.01); *B23K 1/0016* (2013.01); *B23K 3/04* (2013.01); *B23K 3/08* (2013.01); *B23K 3/085* (2013.01); *B23K 20/026* (2013.01); *B23K 37/003* (2013.01); *H01L 24/75* (2013.01); *H01L 24/81* (2013.01); *B23K 2201/42* (2013.01); *H01L 2224/7555* (2013.01); *H01L 2224/75102* (2013.01); *H01L 2224/75266* (2013.01); *H01L 2224/75502* (2013.01); *H01L 2224/81097* (2013.01); *H01L 2224/81098* (2013.01); *H01L 2224/81203* (2013.01); *H01L 2224/81801* (2013.01); *H05K 2203/04* (2013.01); *H05K 2203/1121* (2013.01)

(58) Field of Classification Search
None
See application file for complete search history.

(56) References Cited

U.S. PATENT DOCUMENTS

| | | | | |
|---|---|---|---|---|
| 2,987,982 | A * | 6/1961 | Wilson | 454/265 |
| 3,109,715 | A * | 11/1963 | Johnson et al. | 422/171 |
| 3,741,730 | A * | 6/1973 | Alcott | 22/173 |
| 4,059,429 | A * | 11/1977 | Carmi et al. | 65/355 |
| 4,783,721 | A * | 11/1988 | Yamamoto et al. | 361/689 |
| 4,888,958 | A * | 12/1989 | Ella | 62/237 |
| 4,920,574 | A * | 4/1990 | Yamamoto et al. | 361/703 |
| 5,541,015 | A * | 7/1996 | Tajima et al. | 429/439 |
| 6,347,734 | B1 * | 2/2002 | Downes | 228/180.21 |
| 6,386,422 | B1 * | 5/2002 | Cheng et al. | 228/46 |

(Continued)

*Primary Examiner* — Kiley Stoner
(74) *Attorney, Agent, or Firm* — Schwegman Lundberg & Woessner, P.A.

(57) ABSTRACT

Embodiments of a thermal compression bonding (TCB) process cooling manifold, a TCB process system, and a method for TCB using the cooling manifold are disclosed. In some embodiments, the cooling manifold comprises a pre-mixing chamber that is separated from a mixing chamber by a baffle. The baffle may comprise at least one concentric pattern formed through the baffle such that the primary cooling fluid in the pre-mixing chamber is substantially evenly distributed to the mixing chamber. The pre-mixing chamber may be coupled to a source of primary cooling fluid. The mixing chamber may have an input configured to accept the primary cooling fluid and an output to output the primary cooling fluid.

13 Claims, 8 Drawing Sheets

(56) References Cited

U.S. PATENT DOCUMENTS

| | | | |
|---|---|---|---|
| 7,708,183 B2* | 5/2010 | Dautenhahn | 228/46 |
| 8,066,057 B2* | 11/2011 | Olesen | 165/80.4 |
| 8,955,329 B2* | 2/2015 | Popovic et al. | 60/742 |
| 2004/0194934 A1* | 10/2004 | Hofbauer | 165/150 |
| 2006/0131733 A1* | 6/2006 | Mongia et al. | 257/706 |
| 2006/0169405 A1* | 8/2006 | Smith et al. | 156/308.2 |
| 2006/0289987 A1* | 12/2006 | Chiu | 257/714 |
| 2007/0023275 A1* | 2/2007 | Tanase et al. | 204/192.1 |
| 2007/0093079 A1* | 4/2007 | Aruga et al. | 438/800 |
| 2008/0210383 A1* | 9/2008 | Hirata | 156/498 |
| 2008/0245472 A1* | 10/2008 | Hirata et al. | 156/264 |
| 2009/0057879 A1* | 3/2009 | Garrou et al. | 257/713 |
| 2010/0219229 A1* | 9/2010 | Fujita et al. | 228/110.1 |
| 2011/0085299 A1* | 4/2011 | Mizunaga et al. | 361/692 |
| 2011/0304987 A1* | 12/2011 | Oprins et al. | 361/699 |
| 2012/0088362 A1* | 4/2012 | Hwang et al. | 438/615 |
| 2012/0091186 A1* | 4/2012 | Akiyama et al. | 228/44.3 |
| 2013/0119089 A1* | 5/2013 | Tuyls et al. | 222/146.6 |
| 2013/0122394 A1* | 5/2013 | Shintani et al. | 429/481 |
| 2013/0240115 A1* | 9/2013 | Horng | 156/64 |
| 2013/0299133 A1* | 11/2013 | Li et al. | 165/80.3 |
| 2014/0109619 A1* | 4/2014 | Pontes et al. | 65/111 |
| 2014/0140006 A1* | 5/2014 | Kuhlmann et al. | 361/700 |
| 2014/0144139 A1* | 5/2014 | Alecu et al. | 60/728 |
| 2014/0202636 A1* | 7/2014 | Mayr | 156/378 |
| 2014/0376148 A1* | 12/2014 | Sasaki et al. | 361/234 |
| 2015/0016083 A1* | 1/2015 | Nootens et al. | 361/820 |
| 2015/0090768 A1* | 4/2015 | Kuroda et al. | 228/46 |
| 2015/0129135 A1* | 5/2015 | Lee et al. | 156/378 |
| 2015/0146380 A1* | 5/2015 | Lu et al. | 361/709 |
| 2015/0171047 A1* | 6/2015 | Malatkar et al. | 228/6.2 |

* cited by examiner

THERMAL COMPRESSION BONDING PROCESS COOLING MANIFOLD

TECHNICAL FIELD

Embodiments described herein generally relate to thermal compression bonding processes.

BACKGROUND

Integrated circuit dies may be attached to substrates, circuit boards, or other dies using a process commonly referred to in the art as thermal compression bonding. Solder balls may be attached to various points of the die that are desired to be anchored to the substrate. The die may then be heated to melt the solder balls. The die and substrate may then be compressed such that, when the solder balls cool, the die may be attached to the substrate. A thermal compression bonding (TCB) process bond head may include a heater used during a fabrication process to heat the die, substrate, and solder balls in order to perform the bonding.

Once the die, substrate, and solder balls have been heated and compressed to perform the bonding, the newly formed solder joint may be cooled to complete the TCB process. It may be desired that this cooling be performed as rapidly as possible to preclude die/substrate movement as well as to speed up the fabrication process.

There are general needs for improved cooling solutions for a TCB process.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

A thermal compression bonding (TCB) process bond head may include a heater that may be used during a fabrication process to heat an integrated circuit die and/or substrate with solder balls in order to bond the die to the substrate. The temperature of the heater may be increased to at least the melting point of the solder balls such that they are melted. The die and substrate may then be compressed together in order to perform the bonding.

Once the die and substrate are bonded, the newly formed solder joint should be cooled in order to complete the TCB process. It may be desired that this cooling be performed as rapidly as possible to preclude die/substrate movement as well as to speed up the fabrication process during an assembly line operation. The present active cooling system, illustrated in FIG. 1, may provide an active cooling solution in order to meet predetermined cooling rates in order for the solder joint to solidify quickly.

Figure 1:
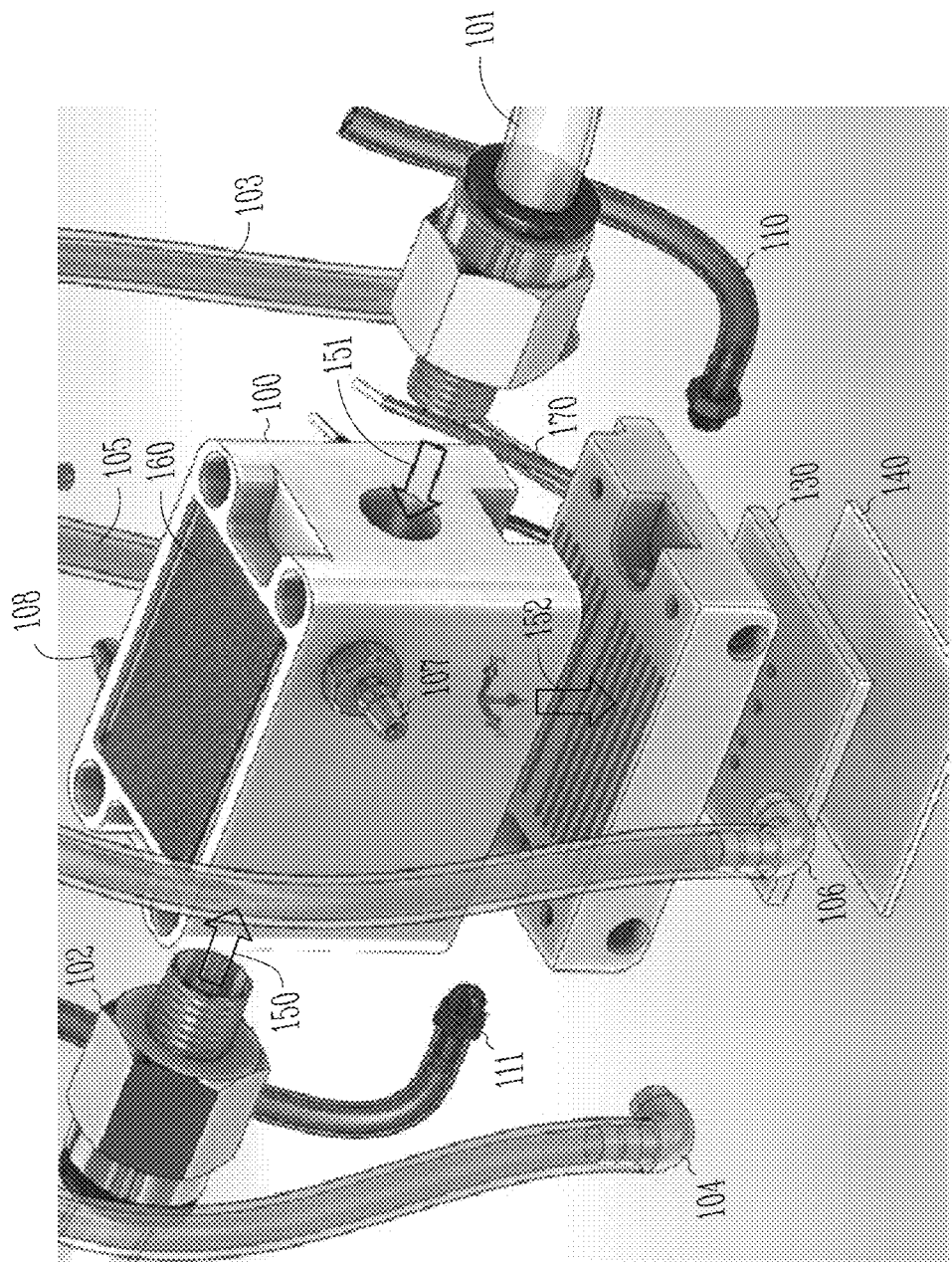
FIG. 1 illustrates an exploded diagram of an embodiment of a TCB process system.

FIG. 1 illustrates an exploded diagram of a TCB process system. The orientations/locations of the various components and fluid/vacuum input/output lines are for purposes of illustration only. The present embodiments are not limited to any one orientation/location of the components and/or quantity/location of the fluid/vacuum input/output lines.

The subsequently referred to cooling fluid may be any type of fluid that comprise cooling or heat transfer properties. Such fluids may include, but not be limited to, air, helium (gas or liquid), carbon dioxide (gas or liquid), compressed air, compressed helium, or compressed carbon dioxide.

The TCB process system components may include a cooling manifold 100, a cooling block 120, a heater 130, and a nozzle 140. In the illustrated embodiment, the cooling block 120 may be coupled to the bottom of the cooling manifold 100, the heater 130 coupled to the bottom of the cooling block 120, and the nozzle may be coupled to the bottom of the heater 130. The configuration and operation of each of these TCB process system components is described subsequently.

Primary cooling fluid inlet lines 101, 102 may be coupled to (e.g., interference fit, threaded) ports in the cooling manifold 100. For example, both the ends of the primary cooling fluid inlet lines 101, 102 and the ports in the cooling manifold 100 may be threaded so that they may be coupled together. The primary cooling fluid inlet lines 101, 102 may then conduct a primary cooling fluid, under pressure, into the cooling manifold 100. The primary cooling fluid inlet lines 101, 102 may be coupled to the same fluid source or different fluid sources so that each line may conduct a different fluid into the pre-mixing chamber 201 of the cooling manifold 100.

A secondary cooling fluid inlet 107 may be used to reduce transmission of heat from the bond head in order to provide thermal isolation of the bond head. A secondary cooling fluid outlet 108 may be located on an opposite side of the cooling manifold 100 from the secondary cooling fluid inlet 107. The secondary cooling fluid may be input through the secondary cooling fluid inlet 107, conducted through channels in a thermal isolation area 160 of the cooling manifold 100, then output through the secondary cooling fluid outlet 108. The thermal isolation area 160 may include grooves and/or fins formed in the top of the cooling manifold 100 to enhance the cooling of the metal structure.

Primary cooling fluid outlet lines 103-106 may be coupled to (e.g., interference fit, threaded) ports in the cooling block 120. The primary cooling fluid may then be able to flow into the cooling manifold from the primary cooling fluid inlet lines 101, 102, through the interior of the cooling manifold 100 (e.g., pre-mixing chamber 201, baffle 200, mixing chamber 202) and the cooling block 120, as shown and described subsequently, and out the primary cooling fluid outlet lines 103-106.

Vacuum lines 110, 111 may be coupled to ports in the cooling block 120. One of the vacuum lines 110 may be associated with a vacuum used to hold the nozzle 140 to the heater 130. The other vacuum line 111 may be associated with a vacuum for the nozzle 140 to hold the die/substrate (not shown) to the nozzle 140 in order to be heated by the heater 130.

The vacuum lines 110, 111 may connect a vacuum source to the cooling block 120. Since the heater 130 is coupled to the bottom of the cooling block 120, holes in the heater 130 line up with vacuum conduits in the cooling block 120 such that air is sucked through the holes in the heater 130 and cooling block 120. This vacuum force may be used to attach a die/substrate to the nozzle/heater to perform the TCB process as described subsequently.

Power lines 170 may be coupled to the heater 130 to provide the power used to generate an increased temperature. The power lines 170 may provide a current to a heating element as described subsequently with reference to FIG. 5.

The arrows 150-152 of FIG. 1 illustrate the flow of cooling fluid. These arrows 150-152 show that the cooling fluid enters through the fluid inlet lines 101, 102, through the cooling manifold 100, and down through the cooling block 120. The various components of the TCB process system are described subsequently in greater detail.

Figure 2:
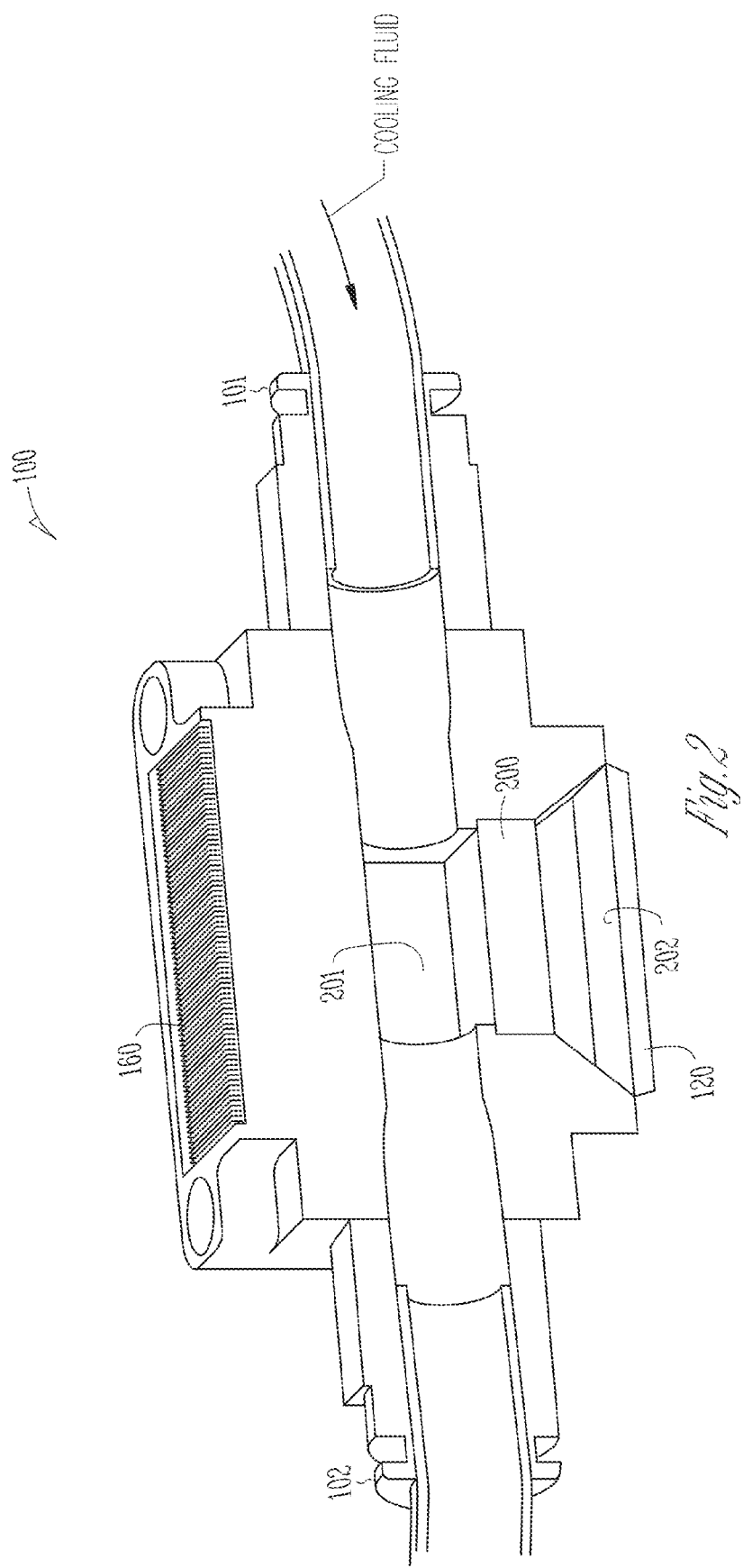
FIG. 2 illustrates a cross-sectional diagram of an embodiment of a cooling manifold in accordance with the embodiment of FIG. 1.

FIG. 2 illustrates a cross-sectional view of the cooling manifold 100 of FIG. 1. This view shows the primary cooling fluid inlet lines 101, 102 coupled to the sides of the cooling manifold 100. The interior of the cooling manifold may include a pre-mixing chamber 201, a mixing chamber 202, and a baffle 200 that separates the pre-mixing chamber 201 from the mixing chamber 202.

The primary cooling fluid inlet lines 101, 102 are coupled to the pre-mixing chamber 201 such that the one or more fluids in the primary cooling fluid inlet lines 101, 102 may be forced, under pressure, into the pre-mixing chamber 201 and mixed prior to going through the baffle 200. The pre-mixing chamber 201 may pre-mix the cooling fluids from the one or more cooling fluid inlet lines 101, 102 prior to being distributed to the mixing chamber by the baffle 200.

Figure 3A:
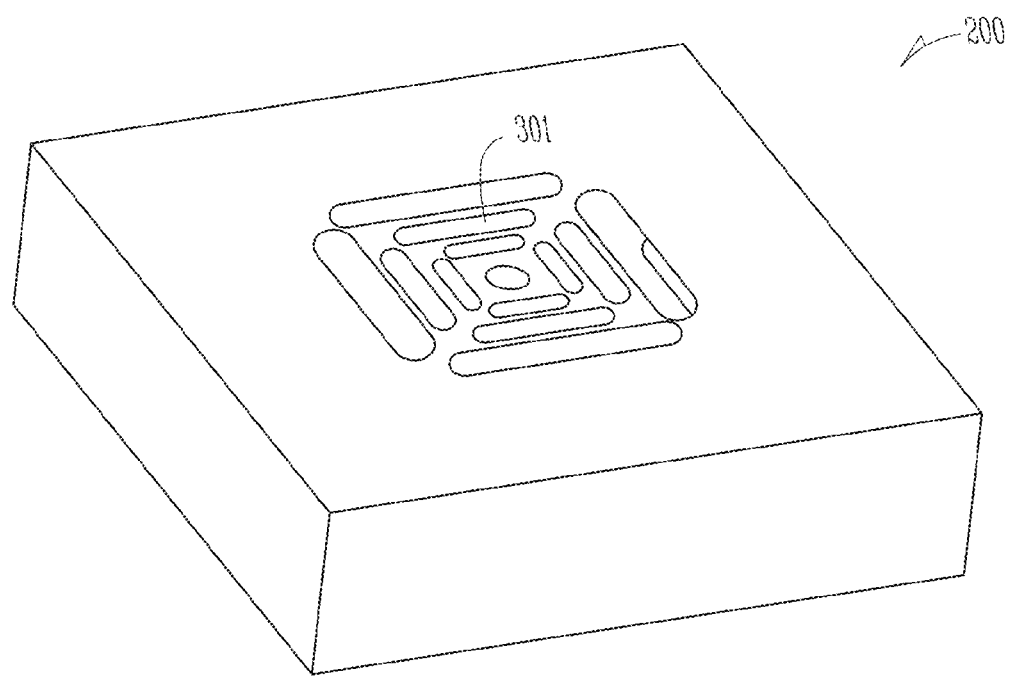
FIGS. 3A and 3B illustrate diagrams of an embodiment of a baffle in accordance with the embodiment of FIG. 1.
Figure 3B:
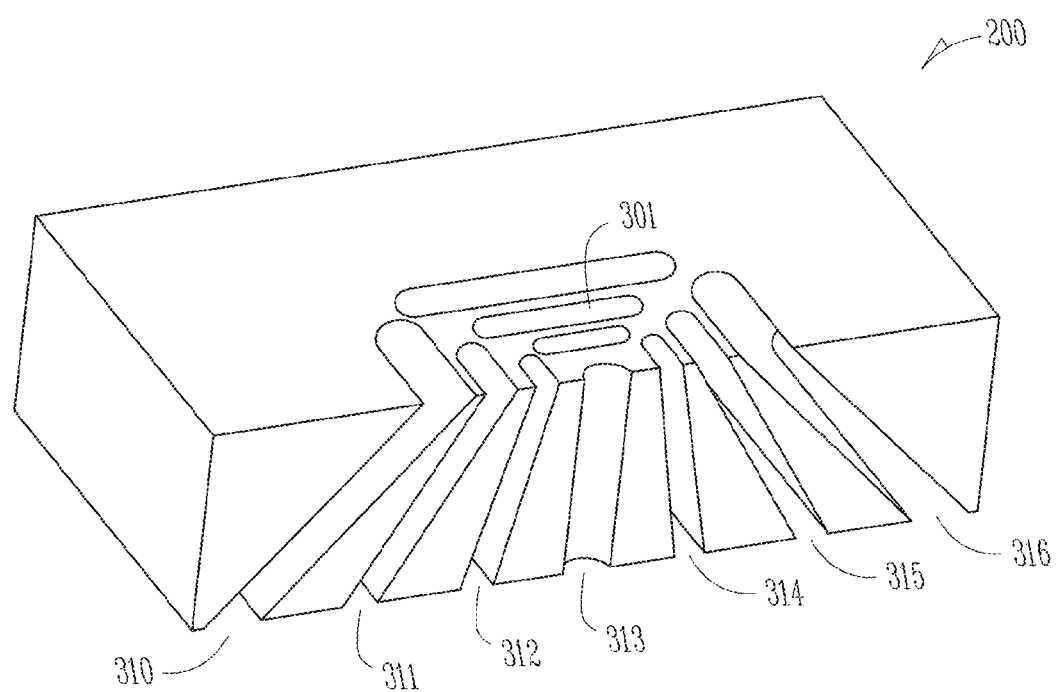

As seen in FIGS. 3A and 3B, and described subsequently, the baffle 200 may evenly distribute the pre-mixed cooling fluid into the mixing chamber 202. The mixing chamber 202 may be immediately below the pre-mixing chamber 201 and have an input coupled to the baffle 200 and an output coupled to the cooling block 120. The mixing chamber 202 may be shaped such that the sides are slanted outwards towards the mixing chamber output in order to have a greater area of the top surface of the cooling block 120 exposed to the cooling fluid of the mixing chamber 202. The angle of slant of the sides of the mixing chamber 202 may be determined by the size of the cooling block 120.

With the cooling block 120 mounted immediately below the mixing chamber 202, the cooling fluid in the mixing chamber 202 may then be input to cooling fluid inlet holes of the cooling block 120. A configuration of the cooling block 120 is described subsequently with reference to FIGS. 4A and 4B.

The cooling manifold 100 may be manufactured using a rapid prototyping three-dimensional (3D) printing method with computer aided design (CAD) data. For example, a metal powder (e.g., aluminum) may be used in a 3D printer that may be controlled by a computer using CAD data to print a plurality of layers until the cooling manifold 100 is complete as indicated in FIG. 1.

In another embodiment, a subtractive method (e.g., computer numerical controlled (CNC) machining) may be used to mill the cooling manifold 100. The cooling block may be milled out of a solid block of metal (e.g., aluminum) or multiple blocks of metal that may then be connected together. Another embodiment may use a combination of the rapid prototyping 3D printing and CNC milling methods.

FIGS. 3A and 3B illustrate top and cross-sectional views, respectively, of the baffle 200 of FIG. 2. As seen in the top view of FIG. 3A, the baffle 200 may include one or more input concentric patterns 301 (e.g., squares, circles) formed through the entire structure and exposed to the pre-mixing chamber 201. As seen in the cross-sectional view of FIG. 3B, the one or more input concentric patterns 301 may angle outward as they transit through a thickness of the baffle structure internally such that the input concentric patterns 301 are smaller than the output concentric patterns 310-316 that are exposed to the mixing chamber 202. When the concentric patterns exit the baffle 200, they have spread out to form the widely spaced output concentric patterns 310-316. This enables the input cooling fluid under pressure to be substantially evenly distributed once it leaves the baffle 200. In an embodiment, the one or more concentric patterns 301 comprise a plurality of concentric patterns 301.

The size and quantity of the concentric patterns 301 of the baffle are for purposes of illustration only. The present embodiments are not limited to any one size or number of concentric patterns 301 formed in the baffle.

The baffle 200 may be fabricated using the 3D printing method and/or the CNC milling method discussed previously. The baffle 200 may be formed as a separate structure that may be inserted into the cooling manifold 100 or it may be formed as an integral part of the cooling manifold 100 as one solid structure.

Figure 4A:
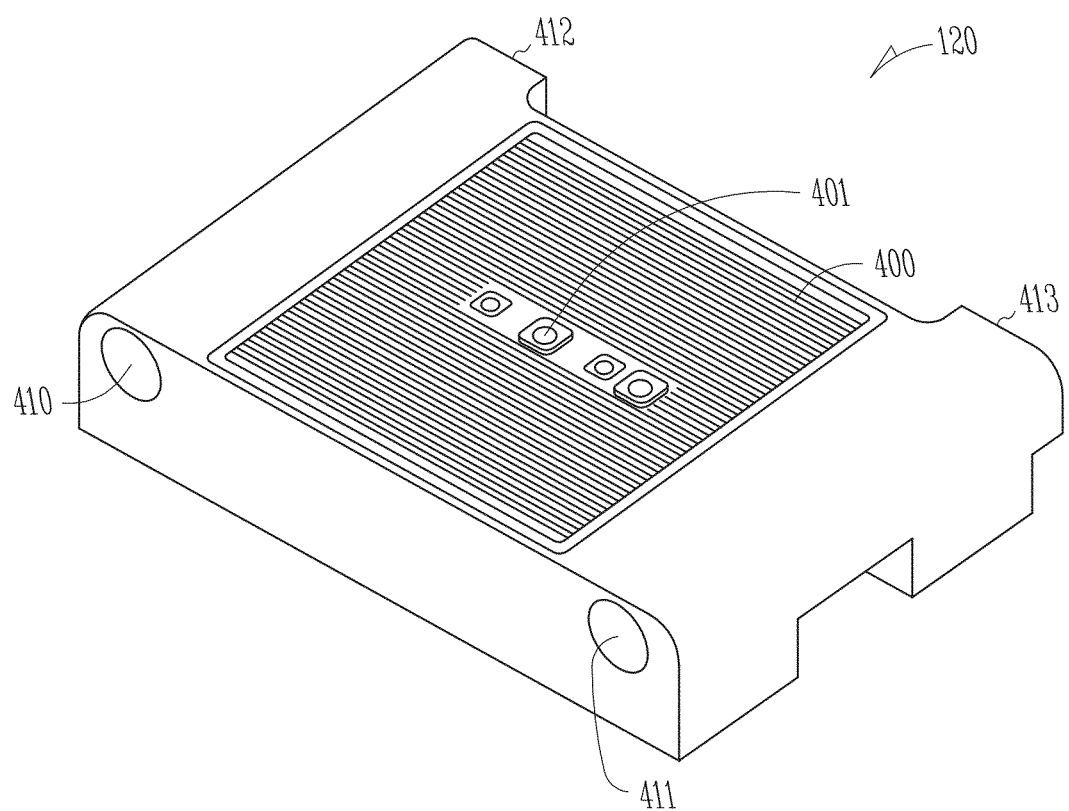
FIGS. 4A and 4B illustrate diagrams of an embodiment of a cooling block in accordance with the embodiment of FIG. 1.
Figure 4B:
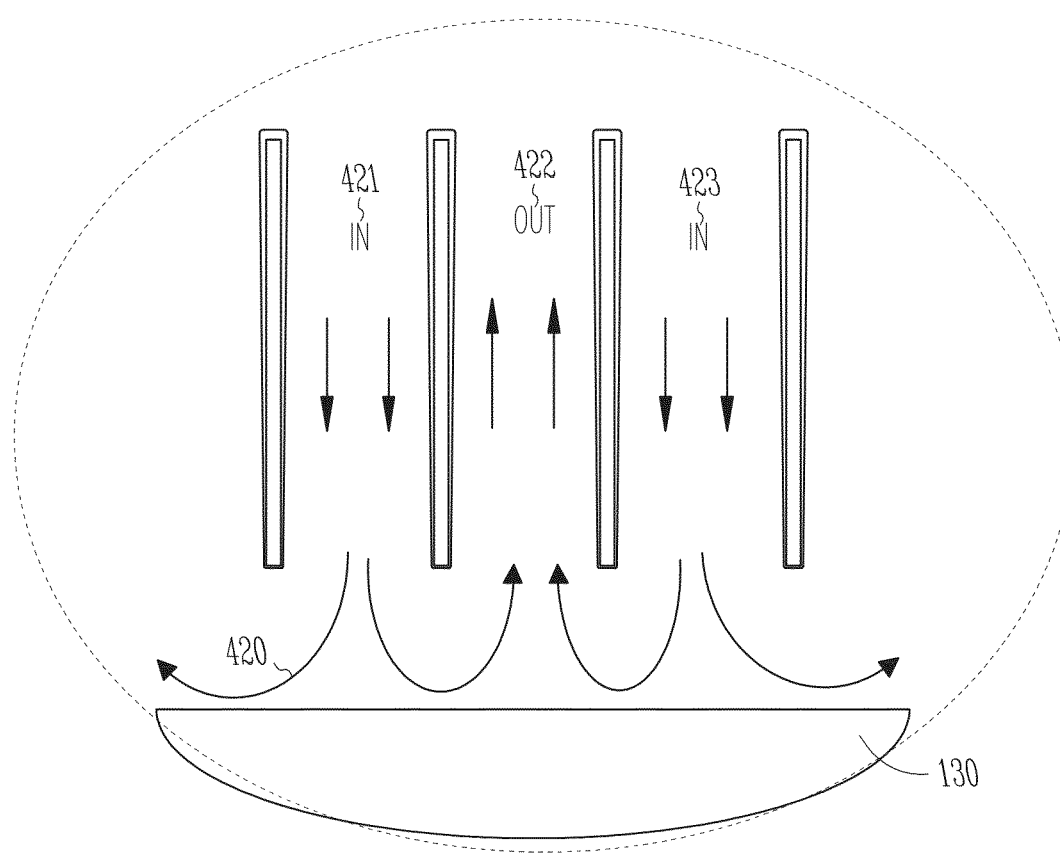

FIGS. 4A and 4B illustrate a 3D view and a cross-sectional view, respectively, of the cooling block 120 of the FIG. 1. FIG. 4A shows the bottom of the cooling block 120 that includes the surface 400 that may be coupled to or in contact with the heater 130 of FIG. 1. This surface 400 may include a plurality of holes and/or slots formed through the structure to enable the cooling fluid to pass from the cooling manifold 100, through the cooling block 120, to the top of the heater 130.

FIG. 4B illustrates the cross-sectional view of the cooling block 120. The plurality of holes 421-423 may include one or more patterns of "fluid in" holes 421, 423 and "fluid out" holes 422. The illustrated view alternates between the "fluid in" holes 421, 423 and the "fluid out" holes 422. The "fluid in" holes 421, 423 provide a means for the cooling fluid from the cooling manifold 100 to reach the channel 420 between the cooling block 120 and the heater 130 surface in order to flow along the heater 130 surface and transfer the heat from the heater 130 surface to the fluid. The channel 420 provides an output path for the now warmed cooling fluid to go through the "fluid out" holes 422 to the inside of the cooling block 120 to be removed through the fluid outlet ports 410-413 as seen in FIG. 4A and FIG. 1.

Referring again to FIG. 4A, a series of vacuum holes 401 are provided in the bottom surface 400 of the cooling block 130 to enable the vacuum lines 110, 111 of FIG. 1 to provide a vacuum to hold the die/substrate (not shown), to be joined with the TCB process, to the heater 130 surface. The series of vacuum holes 401 line up with a series of vacuum holes 502 (see FIG. 5) of the heater 130. Thus, the vacuum may be provided through both the cooling block 120 and the heater 130 to the die/substrate.

Figure 5:
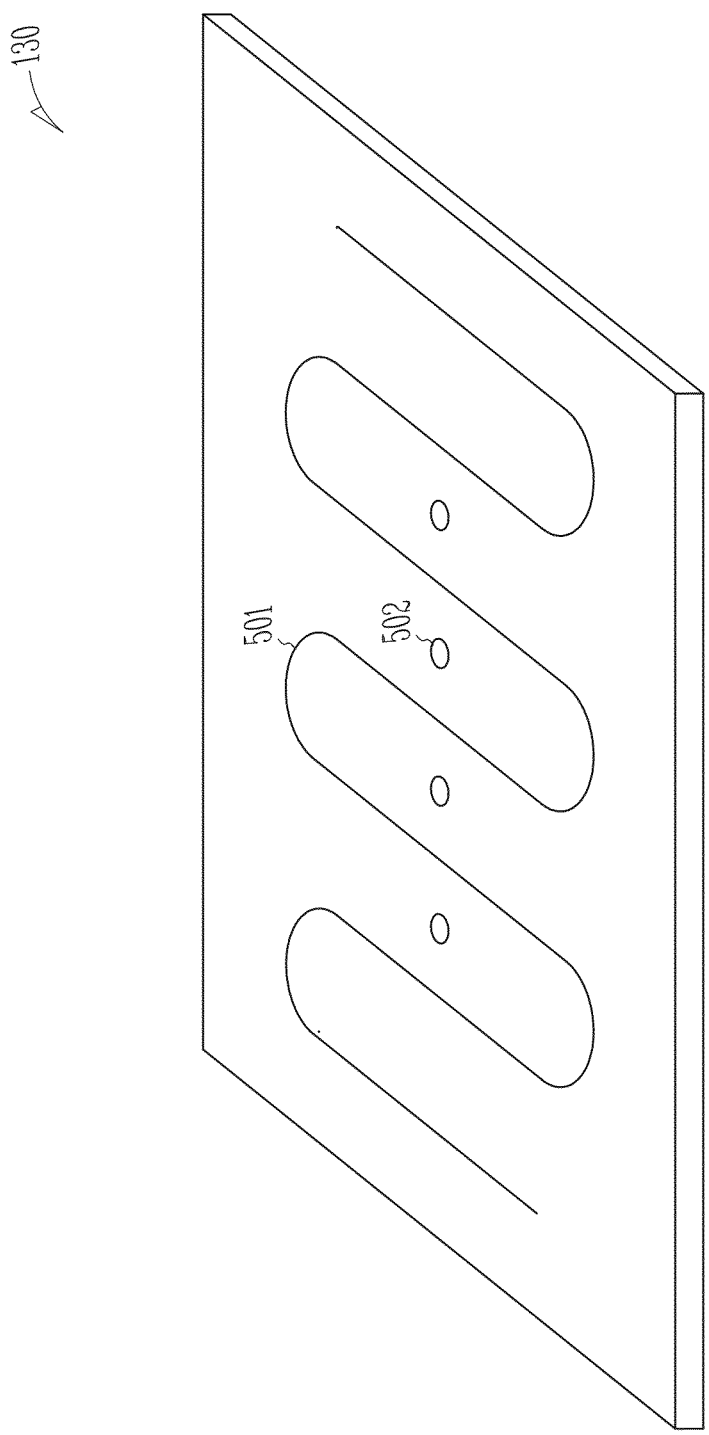
FIG. 5 illustrates a diagram of an embodiment of a heater in accordance with the embodiment of FIG. 1.

FIG. 5 illustrates a diagram of an embodiment of the heater 130 of the TCB process system of FIG. 1. The heater 130 may include one or more vacuum holes 502 that provide a passage for the vacuum to the nozzle 140 in order to hold the die or substrate to the heater's bottom surface with the help of the nozzle 140, as described subsequently.

The heater 130 may also include one or more heating elements 501 that may provide the heat in response to an electrical current being coupled to the one or more heating elements 501. As the current is increased in the heating elements 501, the temperature of the heater 130 may increase. When the current to the heating elements 501 is decreased or turned off, the temperature of the heater 130 may decrease.

Figure 6:
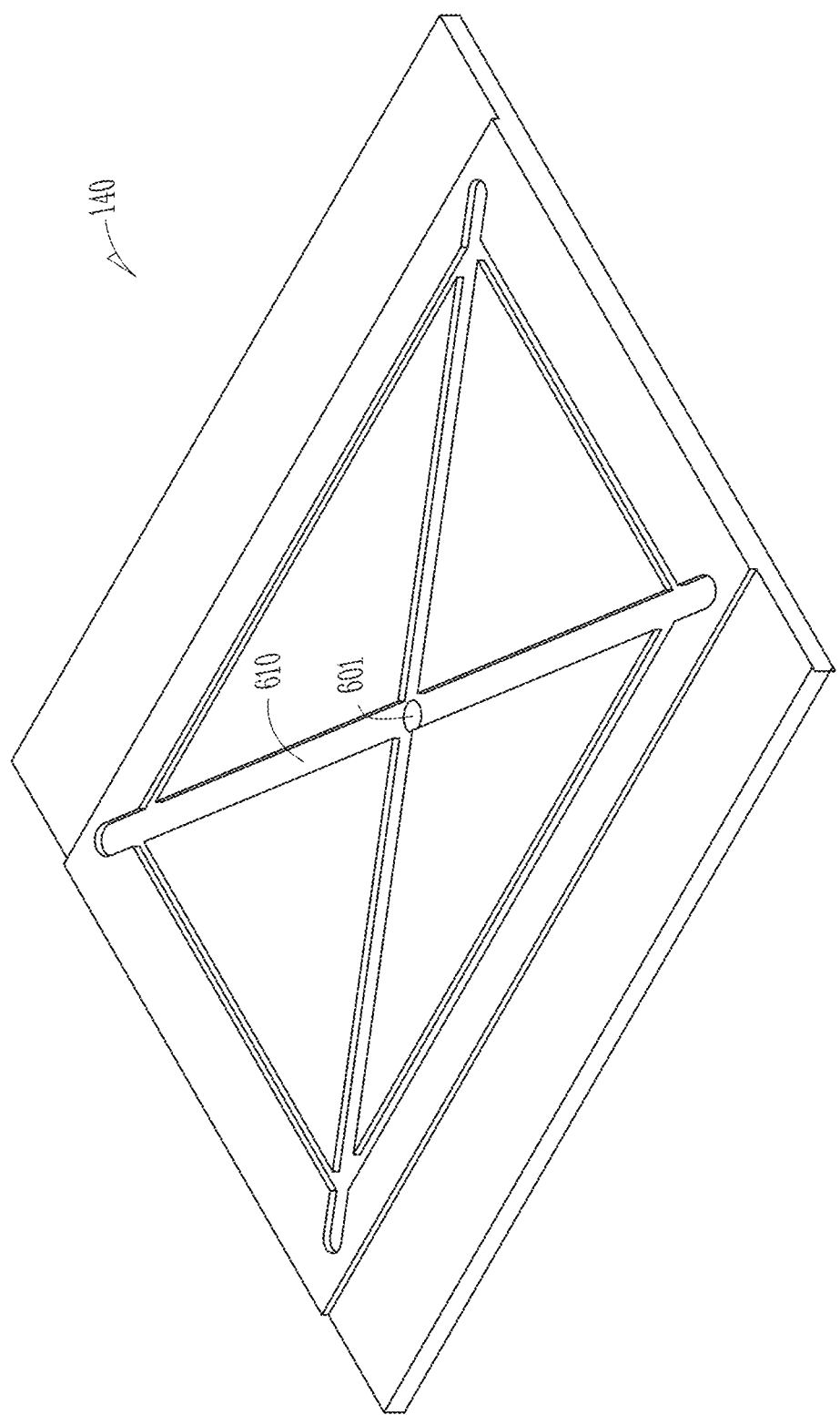
FIG. 6 illustrates a diagram of an embodiment of a nozzle in accordance with the embodiment of FIG. 1.

FIG. 6 illustrates a diagram of an embodiment of the nozzle 140 of the TCB process system of FIG. 1. One or more vacuum holes 601 may line up with the one or more vacuum holes 502 of the heater.

Each die to be joined to a substrate in the TCB process may have a unique nozzle 140. The purpose of the nozzle 140 is to redistribute the vacuum source from the vacuum line 111 from the cooling block 120 and heater 130 in such a way that the die may be held more precisely. Having just a vacuum hole 601 alone in the center of the nozzle may not adequately hold the die because the die might still twist and turn during the TCB process. The grooves 610 in the nozzle 140 may distribute the vacuum force from the vacuum source provided through the vacuum hole 601. The grooves 610 may have a different shape and/or size depending on the size and shape of the die or substrate being attached to the nozzle 140 and the desired shape of the distributed vacuum force.

Figure 7:
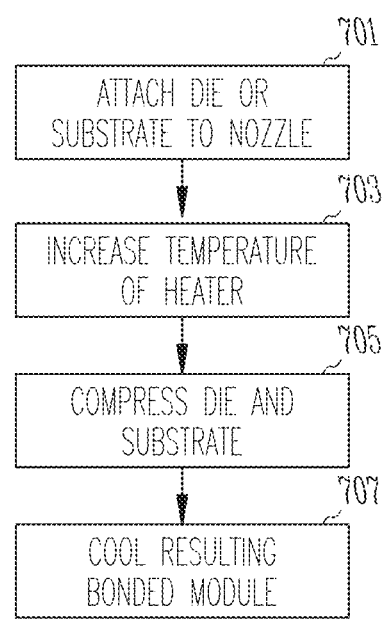
FIG. 7 illustrates a flowchart of an embodiment of a method for performing a TCB method using the TCB process system of FIG. 1.

FIG. 7 illustrates a flowchart of an embodiment of a method for performing a TCB process, using the TCB process system of FIG. 1, to create a solder joint in an integrated circuit module (e.g., die and substrate, die and die, substrate and substrate). A die or substrate may be attached 701 to the nozzle 140 with a vacuum force. The heater 130 may then be turned on and its temperature increased 703 in order to heat solder coupled to the die or substrate to its melting point. The die and/or substrate may then be compressed together 705 to bond the two parts and create the solder joint. The resulting integrated circuit module may then be rapidly cooled 707 in order to cause the solder joint to solidify.

The TCB process of FIG. 7 is for purposes of illustration only. The cooling manifold 100 illustrated previously may be used in any process that may need to rapidly cool a part.

EXAMPLES

Example 1 is a cooling manifold for use in a thermal compression bonding process, the cooling manifold comprising: a pre-mixing chamber coupled to a source of primary cooling fluid, a mixing chamber having an input configured to accept the primary cooling fluid and an output to output the primary cooling fluid, and a baffle coupled between the pre-mixing chamber and the mixing chamber, the baffle comprising at least one pattern formed through the baffle such that the primary cooling fluid in the pre-mixing chamber is distributed to the mixing chamber.

In Example 2, the subject matter of Example 1 can optionally include wherein the source of primary cooling fluid comprises a plurality of primary cooling fluid inlet ports.

In Example 3, the subject matter of Examples 1-2 can optionally include wherein the at least one pattern comprises a plurality of concentric patterns formed through a thickness of the baffle.

In Example 4, the subject matter of Examples 1-3 can optionally include wherein the plurality of concentric patterns angle outward as they transition through the baffle such that an input concentric pattern is smaller than an output concentric pattern.

In Example 5, the subject matter of Examples 1-4 can optionally include wherein the input concentric pattern is exposed to the pre-mixing chamber and the output concentric pattern is exposed to the mixing chamber.

In Example 6, the subject matter of Examples 1-5 can optionally include a secondary cooling fluid input and a secondary cooling fluid output.

In Example 7, the subject matter of Examples 1-6 can optionally include wherein the secondary cooling fluid input is coupled to the secondary cooling fluid output through channels in the cooling manifold such that a secondary cooling fluid is conducted through the channels from the secondary cooling fluid input to the secondary cooling fluid output.

In Example 8, the subject matter of Examples 1-7 can optionally include a thermal isolation area on top of the cooling manifold, the thermal isolation area coupled to the secondary cooling fluid input and the secondary cooling fluid output.

In Example 9, the subject matter of Examples 1-8 can optionally include wherein the thermal isolation area comprises a plurality of grooves and fins.

Example 10 is a thermal compression bonding process system for creating a solder joint in an integrated circuit module, the system comprising: a cooling manifold comprising: a pre-mixing chamber coupled to a plurality of cooling fluid inlets, a mixing chamber having an input that slants towards an output, and a baffle coupled between the pre-mixing chamber and the input of the mixing chamber wherein the baffle comprises a plurality of concentric patterns formed through the baffle such that the cooling fluid in the pre-mixing chamber is substantially evenly distributed into the mixing chamber, a cooling block coupled to the output of the mixing chamber, the cooling block comprising a plurality of fluid in holes and a plurality of fluid out holes, a heater coupled to the cooling block and configured to generate a temperature for melting solder, wherein a channel between the cooling block and the heater enables the cooling fluid from the plurality of fluid in holes to contact the heater and leave the channel through the plurality of fluid out holes, and a nozzle coupled to the heater, the nozzle configured to distribute a vacuum force.

In Example 11, the subject matter of Example 10 can optionally include a vacuum source coupled to the cooling block for creating the vacuum force.

In Example 12, the subject matter of Examples 10-11 can optionally include wherein the heater comprises one or more holes for channeling the vacuum force from the cooling block to the nozzle.

In Example 13, the subject matter of Examples 10-12 can optionally include wherein the nozzle comprises a plurality of grooves for distributing the vacuum force in response to a die size of the integrated circuit module.

In Example 14, the subject matter of Examples 10-13 can optionally include wherein the cooling fluid comprises one of air, gaseous helium, liquid helium, gaseous carbon dioxide, liquid carbon dioxide, compressed air, compressed helium, or compressed carbon dioxide.

In Example 15, the subject matter of Examples 10-14 can optionally include wherein the cooling block comprises a plurality of cooling fluid out ports for conducting the cooling fluid from the cooling fluid out holes away from the cooling block.

Example 16 is a method for thermal compression bonding, the method comprising: generating a heat high enough to melt solder of one of a first die or a first substrate, compressing the first die or the first substrate to one of a second die or a second substrate, and cooling the solder with a cooling manifold having a pre-mixing chamber that is separated from a mixing chamber by a baffle wherein the baffle comprises a plurality of concentric patterns through a thickness of the baffle such that a primary cooling fluid from the pre-mixing chamber is substantially evenly distributed into the mixing chamber.

In Example 17, the subject matter of Example 16 can optionally include forming the cooling manifold by three-dimensional printing.

In Example 18, the subject matter of Examples 16-17 can optionally include coupling a plurality of cooling fluid inputs to the cooling manifold.

In Example 19, the subject matter of Examples 16-18 can optionally include: coupling a plurality of cooling fluid outputs to a cooling block that is coupled to the mixing chamber of the cooling manifold, causing the primary cooling fluid to enter the cooling manifold through the pre-mixing chamber, causing the primary cooling fluid to enter the mixing chamber through the baffle, and causing the primary cooling fluid to flow through a channel between the heater and the cooling block and exit the cooling block.

In Example 20, the subject matter of Examples 16-19 can optionally include introducing a secondary cooling fluid into the cooling manifold.

What is claimed is:

1. A cooling manifold for use in a thermal compression bonding process, the cooling manifold comprising:
   a pre-mixing chamber coupled to a source of primary cooling fluid;
   a mixing chamber having an input configured to accept the primary cooling fluid and an output to output the primary cooling fluid;
   a baffle coupled between the pre-mixing chamber and the mixing chamber, the baffle comprising at least one pattern formed through the baffle such that the primary cooling fluid in the pre-mixing chamber is distributed to the mixing chamber; and
   a secondary cooling fluid input coupled to a secondary cooling fluid output through channels in the cooling manifold such that a secondary cooling fluid is conducted through the channels from the secondary cooling fluid input to the secondary cooling fluid output.

2. The cooling manifold of claim 1 wherein the source of primary cooling fluid comprises a plurality of primary cooling fluid inlet ports.

3. The cooling manifold of claim 1 wherein the at least one pattern comprises a plurality of concentric patterns formed through a thickness of the baffle.

4. The cooling manifold of claim 3 wherein the plurality of concentric patterns angle outward as they transition through the baffle such that an input concentric pattern is smaller than an output concentric pattern.

5. The cooling manifold of claim 4 wherein the input concentric pattern is exposed to the pre-mixing chamber and the output concentric pattern is exposed to the mixing chamber.

6. The cooling manifold of claim 1 further including a thermal isolation area on top of the cooling manifold, the thermal isolation area coupled to the secondary cooling fluid input and the secondary cooling fluid output.

7. The cooling manifold of claim 6 wherein the thermal isolation area comprises a plurality of grooves and fins.

8. A thermal compression bonding process system for creating a solder joint in an integrated circuit module, the system comprising:
   a cooling manifold comprising:
      a pre-mixing chamber coupled to a plurality of cooling fluid inlets;
      a mixing chamber having an input that slants towards an output; and
      a baffle coupled between the pre-mixing chamber and the input of the mixing chamber wherein the baffle comprises a plurality of concentric patterns formed through the baffle such that the cooling fluid in the pre-mixing chamber is substantially evenly distributed into the mixing chamber;
   a cooling block coupled to the output of the mixing chamber, the cooling block comprising a plurality of fluid in holes and a plurality of fluid out holes;
   a heater coupled to the cooling block and configured to generate a temperature for melting solder, wherein a channel between the cooling block and the heater enables the cooling fluid from the plurality of fluid in holes to contact the heater and leave the channel through the plurality of fluid out holes; and
   a nozzle coupled to the heater, the nozzle configured to distribute a vacuum force.

9. The system of claim 8 further comprising a vacuum source coupled to the cooling block for creating the vacuum force.

10. The system of claim 9 wherein the heater comprises one or more holes for channeling the vacuum force from the cooling block to the nozzle.

11. The system of claim 8 wherein the nozzle comprises a plurality of grooves for distributing the vacuum force in response to a die size of the integrated circuit module.

12. The system of claim 8 wherein the cooling fluid comprises one of air, gaseous helium, liquid helium, gaseous carbon dioxide, liquid carbon dioxide, compressed air, compressed helium, or compressed carbon dioxide.

13. The system of claim 8 wherein the cooling block comprises a plurality of cooling fluid out ports for conducting the cooling fluid from the cooling fluid out holes away from the cooling block.

* * * * *